Sept. 27, 1960 R. H. OKADA 2,954,163

TRANSISTOR BINARY COUNTER

Filed Feb. 12, 1954

INVENTOR
ROBERT H. OKADA
BY
Donald W. Phillion
ATTORNEY 2,954,163

TRANSISTOR BINARY COUNTER

Robert H. Okada, Bryn Mawr, Pa., assignor to Burroughs Corporation, Detroit, Mich., a corporation of Michigan Filed Feb. 12, 1954, Ser. No. 409,950

7 Claims. (Cl. 235—92)

This invention relates generally to binary counters and more particularly to binary counters utilizing transistors as the storage and transfer elements.

There are many types of binary counter circuits in the prior art including electronic, magnetic, and mechanical binary counters. Each of these have particular advantages for particular uses. No one of them, however, combines the features of high speed operation, low power consumption, and compactness. A binary counter having such characteristics would mark a definite improvement in the art.

An object of the present invention is a binary counter having high speed operation, low power consumption, and compactness.

A further object of the invention is a binary counter utilizing transistors as the storage and transfer elements.

A third object of the invention is the improvement of binary counters generally.

In accordance with one embodiment of the invention, a plurality of transistors are arranged in a row, each of said transistors having two stable operating points for a given load, and a plurality of coupling circuits coupling together adjacent ones of said transistors in said row of transistors. Each of said coupling circuits comprises a transformer and a first capacitive-resistive differentiating network, the input winding of the transformer being connected to the collector electrode of a given transistor and the said capacitive-resistive network connecting the output of said transformer to the emitter electrode of the next adjacent transistor. A second capacitive-resistive network is connected to the input emitter electrode of the first transistor in said row of transistors. Input means are adapted to apply a unilateral, or unidirectional pulse to the second capacitive-resistive network.

In accordance with one feature of the invention, the coupling circuits have circuit constants which reshape the output pulses from the first of the two transistors coupled together thereby into input pulses having a positive portion with a negative overshoot for the second of the two transistors coupled together thereby. It is also possible to utilize circuitry adapted to produce input pulses having a negative portion with a positive overshoot. The positive and negative portions of these waveforms are a magnitude adapted to cause the said second transistor to change from its first bistable state to its second bistable state or from its second bistable to its first bistable state.

These and other objects and features of the invention will be more fully understood from the following detailed description when read in conjunction with the drawings in which.

Figure 1:
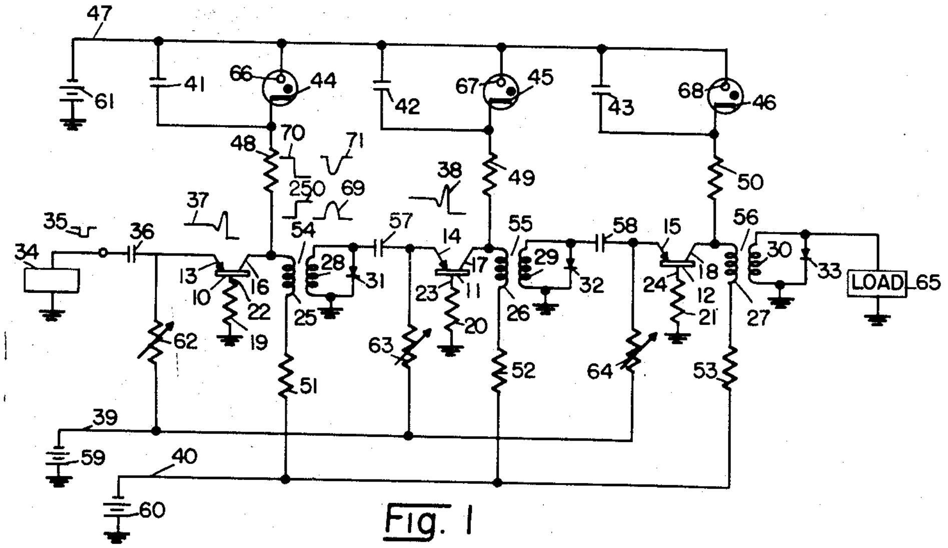
Fig. 1 shows a schematic sketch of one embodiment of the invention.

Referring now to Fig. 1, transistors 10, 11, and 12 each have an emitter electrode 13, 14, and 15 respectively, a collector electrode 16, 17, and 18 respectively, and a base electrode 22, 23, and 24 respectively. Transformers 54, 55, and 56 couple together adjacent transistors in said row of transistors. Each of said transformers 54, 55, and 56 comprises a primary winding 25, 26, and 27 respectively and a secondary winding 28, 29, and 30 respectively. The collector electrodes 16, 17, and 18 of the transistors 10, 11, and 12 are connected to the primary windings 25, 26, and 27 respectively of the transformers 54, 55, and 56 respectively. The emitter electrodes 14 and 15 of the transistors 11 and 12 are connected to the secondary windings 28 and 29 of the transformers 54 and 55 respectively through capacitances 57 and 58 respectively. The primary windings 25, 26, and 27 of the transformers 54, 55, and 56 are connected to battery source 60 through resistances 51, 52, and 53 respectively. Asymmetrical, or unidirectional current conducting, devices 31, 32, and 33 are connected across secondary windings 28, 29, and 30 respectively. The terminals of the secondary windings 28, 29, and 30 other than the ones connected to the said emitter electrodes are connected to ground potential. Variable emitter electrode resistors 62, 63, and 64 connect the emitter electrodes 13, 14, and 15 respectively to battery source 59 through conductor 39. The emitter resistances 62, 63, and 64 are made adjustable to allow for interchanging transistors. With this adjustment all transistors with reasonable current gains can be used as long as their peak characteristic point 74 (shown in Fig. 3) is above the emitter bias voltage 59. Voltage pulse input source 34 is connected to emitter electrode 13 through capacitance 36. Load 65 is connected to the secondary winding 30 of transformer 56. A negative pulse 35 is shown as the output of the source 34. It is to be noted that a positive pulse can also be used. Resistors 19, 20, and 21 connect the base electrodes 22, 23, and 24 respectively to ground.

Neon filled tubes 44, 45, and 46 which are utilized to enable an observer to visually detect the condition of the various transistors are connected to collector electrodes 16, 17, and 18 through resistors 48, 49, and 50 respectively. Capacitances 41, 42, and 43 are connected across neon tubes 44, 45, and 46 respectively. The battery source 61 is connected to the cathodes 66, 67, and 68 of the neon tubes 44, 45, and 46 respectively. It is to be noted that although only three stages of operation are shown in Fig. 1 that more stages can be added, if desired. Each of the stages has an output of sufficient power to drive the next succeeding stage so that the number of stages allowable are not limited.

In one typical embodiment of the invention the following values are used. Primary windings 25, 26, and 27 each have 70 turns. Secondary windings 28, 29, and 30 each have 35 turns. Capacitances 36, 57, and 58 each have a value of .00022 microfarad. Capacitances 41, 42, and 43 each have a value of .001 microfarad. Resistances 51, 52, and 53 each have a value of 4700 ohms. Variable resistances 62, 63, and 64 each have a range of from 2000 ohms to 8000 ohms. Resistances 48, 49, and 50 each have a value of 300,000 ohms. Battery sources 61, 59, and 60 have values of negative 100 volts, negative 11.5 volts and negative 45 volts respectively. It is to be understood that the circuit values designated herein represent but one design of the invention and that many other designs incorporating different values of circuit constants may be used.

Figure 2:
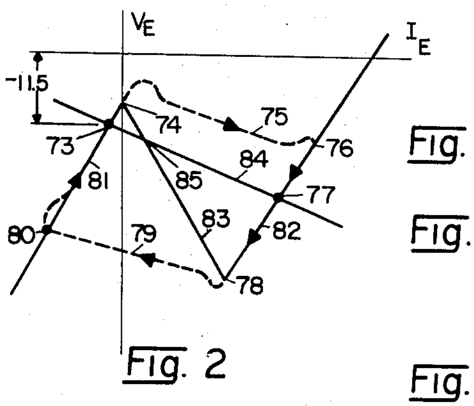
Fig. 2 shows the emitter voltage-current characteristic for a single transistor bistable circuit and the emitter load line.

Referring now to Fig. 2, the curve represented by lines 81, 83, and 82 is a representative characteristic curve of the transistors. The ordinate is the emitter voltage and the abscissa is the emitter current. It will be observed that the emitter load line 84 passes through the characteristic curve at three points, 73, 85, and 77. Two of these points, 73 and 77, represent stable operating points and the third point 85 represents a non-stable operating due to the negative resistance character of the operating characteristic of the transistor along this portion of the curve. Dotted line 75 represents the dynamic characteristic of a transistor when a positive pulse is applied to the emitter electrode at a time when the transistor is operating at point 73. The dotted line 79 represents the dynamic characteristic of a transistor when a negative pulse is applied to the emitter electrode at a time when the transistor is operating at point 77. It is to be noted that the dynamic characteristic line 75 and the dynamic characteristic line 79 do not follow the static characteristic line 83. This feature permits the use of the transistor as a binary counter. More specifically, when a pulse having a negative portion followed by a positive overshoot is applied to the emitter electrode of a transistor when the transistor is operating at a point 73, the dynamic characteristic can be traced, during the negative portion of the pulse, down the line 81, and during the positive portion of the pulse up the line 81, and across the dotted line 75. At the cessation of the pulse the operating point of the transistor will return to point 77 on the line 82. If a second pulse is applied to the emitter terminal the operating point of the transistor will travel down the characteristic line 82, and across the line 79 to the point 80. Due to the inherent capacitance in the circuit the transistor will take a finite amount of time to return to the normal operating point 73. During this time the positive portion of the input pulse occurs and drives the operating point of the transistor towards point 74. However, since the transistor started from an operating condition represented by some point near point 80 at the beginning of the positive portion of the pulse, and further, due to the limited amplitude of the pulse, the operating point of the transistor will not be driven beyond the point 74. Consequently, at the cessation of the second input pulse, the transistor will not revert to its operating point 77 on the portion of the characteristic line designated by the reference character 82, but will instead assume the operating point represented by the reference character 73. Thus a complete cycle of operation is performed. The application of a third pulse will cause the same effect as the application of the first pulse, i.e., the operating point will shift from point 73 to point 77.

Figure 3:
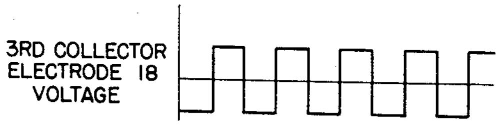
Figs. 3 and 4 show typical voltage curves at collector electrodes.
Figure 4:
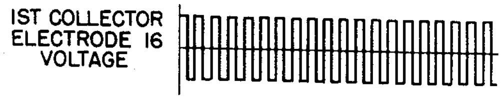

Referring to Figs. 3 and 4 there is shown the voltage waveforms of collector electrodes 18 and 16 respectively. It can be seen that the frequency of the voltage waveform of collector electrode 16 is four times that of the frequency of the voltage waveform of collector electrode 18. This is due to the fact that collector electrode 16 is in the first stage of the binary counter and collector electrode 18 is in the third stage of the counter. This will become clearer from the description of operation of the invention.

Figure 5:
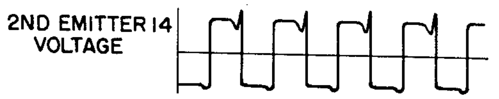
Figs. 5 and 6 show typical voltage curves at emitter electrodes.
Figure 6:
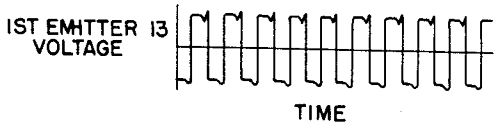

Figs. 5 and 6 show the emitter voltage waveforms of emitter electrodes 14 and 13 which are associated respectively with the second stage and the first stage of the binary counter. The frequency of the waveform of Fig. 6 is twice the frequency of the waveform of Fig. 5. This is because emitter 14 is associated with the second stage of the binary counter and emitter 13 is associated with the first stage of the binary counter.

Referring again to Fig. 1, the operation of the circuit will be described in detail. Assume that all of the transistors 10, 11, and 12 are in a condition represented by point 73 in Fig. 2. Assume that a unidirectional negative pulse 35 as shown in Fig. 1 is applied through the capacitance 36 from the input source 34. This pulse will be differentiated by the capacitor 36-resistor 62 network to form a bidirectional pulse such as pulse 37 shown in Fig. 1. This pulse 37 which is impressed upon emitter electrode 13 will cause the transistor 10 to change from one stable operating state corresponding to point 73 of Fig. 2 to its other stable operating state at point 77. The change in collector current during this transition is shown by curve 250 of Fig. 1. The emitter current during this transition period has been discussed previously herein with respect to Fig. 2. The current from the collector electrode 16 is differentiated by the pulse transformer 54 to produce a unidirectional pulse shape 69 shown in Fig. 1. This positive going pulse 69 is short circuited or clipped through the asymmetrical device 31 so that no appreciable current flows into the capacitor 57-resistance 63 differentiating circuit. The circuit is now in a condition whereby the transistor 10 is in its high current state and the transistors 11 and 12 are in their low current states. It is to be noted that a positive input pulse may be transmitted from the source 34 as well as a negative input pulse. When a positive going pulse is applied to the differentiating circuit comprised of capacitor 36 and resistor 62, the differentiating circuit produces a bidirectional output pulse which is applied to the emitter 13. The phase of the output pulse produced by the differentiating circuit is reversed as compared with the output signal 37 produced when a negative pulse is applied. The leading edge of the collector current pulse has a greater, or steeper, slope than the trailing edge. By reversing the secondary winding of the pulse transformer such as secondary winding 28 of pulse transformer 54, a negative pulse may be obtained from the positive going pulse of the collector current of transistor 10 of the preceding stage.

Assume that another negative input pulse similar to pulse 35 is generated from source 34. This pulse will cause the transistor 10 to change from its high current condition to its low current condition to produce a collector current waveform 70 shown in Fig. 1. Waveform 70 is differentiated by the pulse transformer 54 to produce a negative going pulse 71 shown in Fig. 1. Because of the high back impedance of asymmetrical device 31, the current pulse 71 will not flow therethrough, but rather will flow into the capacitance 57-resistance 63 differentiating circuit which will produce a bidirectional pulse 38 as is shown in Fig. 1. The pulse 38 is impressed upon the emitter electrode 14 of transistor 11 to cause the said transistor 11 to change from a condition of low current to a condition of high current in accordance with the theory described hereinbefore. A third pulse from source 34 will cause the transistor 10 to change from a condition of low current to a condition of high current but will not cause any other transistor to change its state. Thus, the first transistor (transistor 10) and the second transistor (transistor 11) in aid row of ransistor will be in a condtion of high current and will indicate a binary total of three, i.e., a binary bit of "1" ($2^0$) in transistor 10 and a binary bit of "1" ($2^1$) in transistor 11. If now a fourth input pulse is generated from source 34, the transistor 10 will change from a condition of high current to a condition of low current so that a pulse will flow from the collector electrode thereof of a polarity to cause the transistor 11 to change from a condition of high current to a condition of low current indicating a binary bit of "0" in transistor 10 and also in transistor 11. The change in condition of transistor 11 will produce a collector electrode current which will be of a polarity adapted to change transistor 12 from a condition of low current to a condition of high current which represents a stored binary bit of "1" ($2^2$). Since transistor 12 is the third transistor in said row of transistors, this represents a decimal count of "4" which is the number of pulses entered into the device in the above illustration.

The collector voltage swing of each transistor from its low current swing is approximately 15 volts across the associated collector electrode resistance 51, 52, and 53. The neon filled tubes 66, 67, and 68 are used to visually indicate to an observer the condition of the associated transistors. They operate in the following manner from the collector electrode voltage swing. When the transistors are in their low current state, the neon tubes are in an off condition since the potential drop thereacross is insufficient to cause ionization of the neon tubes. As soon as the associated transistor (transistor 10 for example) assumes its high current condition the neon tube 44 will ionize due to the additional potential drop across the resistor 51. In the absence of such a potential drop the potential across the neon tube is the difference between the potential of battery source 61 and the potential of battery source 60 which is equal to 55 volts. The voltage drop across the resistor 51 due to the high condition collector current therethrough is about 15 volts. Consequently, about 70 volts is applied across the neon tube 44 when the transistor 10 is in its high current state, which is sufficient to ionize the neon tube 44. The tube will stay ionized as long as the transistor 10 is in its high current condition. As soon as the transistor is caused to assume its low current condition the circuit combination of inductance 25 and capacitance 41 form a type of relaxation oscillator which will quench the neon tube on its first negative swing. The decreement of this oscillation is such that next charge cycle will not have enough voltage to fire the neon tube. The relaxation oscillator eliminates the difficulty of not having enough collector swing to quench the neon tube once it has ionized.

It is to be noted that the forms of the invention herein shown and described are but preferred embodiments of the same, and various changes may be made in the values of circuit and in circuit arrangement without departing from the spirit or scope of the invention.

What is claimed is:

1. A binary counter comprising a plurality of bistable circuits connected in cascade; each of said bistable circuits comprising an input terminal, a semiconductor device having an emitter and a collector, an output terminal; a differentiating circuit connected between the input terminal and the emitter of the semiconducor device; a transformer connected between the collector and the output terminal, and a clipping circuit connected to said output terminal so that unidirectional pulses are produced at the output terminal, the input terminal of the first bistable circuit adapted to have applied to it unidirectional input pulses, the input terminal of each succeeding bistable circuit adapted to be connected to the output terminal of its immediately preceding bistable circuit.

2. A binary counter comprising a plurality of bistable circuits connected in cascade; each of said bistable circuits comprising a transistor including a base, a collector and an emitter, circuit means for causing said transistor to have two stable states, an input terminal, a differentiating circuit connected between said input terminal and the emitter of the transistor, said differentiating circuit in response to each input pulse applied to it producing a bidirectional pulse, the amplitude of the positive and negative swings of the bidirectional pulse being sufficient to cause the transistor to change from one stable state to the other once for each bidirectional pulse produced, a pulse transformer, an output terminal, said pulse transformer being connected between the collector of the transistor and the output terminal of the bistable circuit, and a clipping circuit connected to the output terminal to permit unidirectional pulses to be applied to the differentiating circuit of the succeeding bistable circuit.

3. A binary counter comprising a plurality of bistable circuits connected in cascade; each bistable circuit comprising a transistor including base, collector and emitter, circuit means for causing the emitter characteristics of said transistor to have a negative impedance over a portion of the transistor's operative range; an input terminal, a resistance capacitance differentiating circuit connected to said input terminal, said differentiating circuit in response to each input pulse applied to it producing a bidirectional pulse, circuit means for applying each bidirectional pulse to said emitter, the amplitude of the positive and negative swings of each bidirectional pulse being sufficient to cause the transistor to change from one stable state to the other once for each bidirectional pulse produced, a pulse transformer and an output terminal, said pulse transformer being connected between the collector of the transistor and said output terminal, and unidirectional current conducting means connected to the output terminal to permit unidirectional pulses of one polarity to be applied to the differentiating circuit of the succeeding bistable circuit.

4. A binary counter comprising a plurality of bistable circuits connected in cascade, each of said bistable circuits comprising an input terminal, a transistor having an emitter, a collector and base; a resistor capacitor differentiating circuit interconnecting the input terminal and the emitter of the transistor, a pulse transformer having primary and secondary windings, one terminal of the primary winding being connected to the collector of the transistor, a collector resistor, the other terminal of said primary winding adapted to be connected through said collector resistor to a suitable source of collector potential; an output terminal, said output terminal being connected to one terminal of the secondary winding of the pulse transformer, the other terminal of the secondary winding of the pulse transformer adapted to be connected to a point at reference potential; unidirectional current conducting means connected between the output terminal and said point at reference potential; the input terminal of the first bistable circuit of the counter adapted to have applied to it unidirectional input pulses.

5. A binary counter as recited in claim 4 in which each bistable circuit has indicating means for visually identifying the stable state of each of said circuits, said indicating means comprising a gas discharge device, a capacitor shunting said discharge device, a resistor connecting one electrode of said device to the collector of the transistor of the stage with which each discharge device is associated, the other electrode of each discharge device adapted to be connected to a direct current source of potential.

6. A bistable circuit comprising a transistor having an emitter, a collector and a base, an input terminal adapted to have applied to it unidirectional input pulses, a differentiating circuit, means connecting the input terminal to the differentiating circuit, said differentiating circuit in response to each unidirectional input pulse producing a bidirectional pulse, means for applying said bidirectional pulse to the emitter of said transistor; a transformer having primary and secondary windings, a source of collector potential, circuit means connecting one terminal of said primary winding to the collector of the transistor, a resistor connecting the other terminal of the primary winding to said source of collector potential; an output terminal, circuit means connecting one terminal of the secondary winding to the output terminal, circuit means connecting the other terminal of the secondary winding to a point at reference potential, and a unidirectional current conducting device connected between the output terminal and said point at reference potential.

7. The bistable circuit as recited in claim 6 having indicating means for visually identifying the stable state of said circuit, said indicating means comprising a gas discharge tube having two electrodes, a capacitor shunting said tube, and a second resistor connecting one electrode of said tube to the collector of the transistor, the other electrode adapted to be connected to a direct current source of potential.

References Cited in the file of this patent

UNITED STATES PATENTS

| | | |
|---|---|---|
| 2,594,336 | Mohr | Apr. 29, 1952 |
| 2,595,208 | Bangert | Apr. 29, 1952 |
| 2,614,141 | Edson | Oct. 14, 1952 |
| 2,644,897 | Lo | July 7, 1953 |
| 2,651,728 | Wood | Sept. 8, 1953 |
| 2,697,178 | Isborn | Dec. 14, 1954 |

OTHER REFERENCES

"Stabilized Single Transistor Binary Counter," by R. L. Trent, "The Transistor," by Bell Laboratories, New York, pp. 464–468.

The Transistor (Ryder et al.), 1951, page 185.